United States Patent [19]

Pfahnl et al.

[11] 3,890,177

[45] June 17, 1975

[54] TECHNIQUE FOR THE FABRICATION OF AIR-ISOLATED CROSSOVERS

[75] Inventors: Arnold Pfahnl, Allentown; Walter Worobey, Center Valley, both of Pa.

[73] Assignee: Bell Telephone Laboratories, Incorporated, Murray Hill, N.J.

[22] Filed: Mar. 8, 1973

[21] Appl. No.: 339,175

Related U.S. Application Data

[63] Continuation of Ser. No. 175,501, Aug. 27, 1971, abandoned.

[52] U.S. Cl. ........................ 156/7; 29/578; 29/580; 29/625; 117/130 E; 117/212; 117/217; 156/13; 156/18; 204/15; 204/23; 204/46 R; 204/52 R

[51] Int. Cl. ........................ H05k 3/06

[58] Field of Search ............. 29/424, 578, 625, 580, 29/589, 590; 156/3, 7, 11, 17, 18; 117/212, 217, 130 E; 96/36.2; 204/15, 18 R, 23, 46 R, 52 R

[56] References Cited

UNITED STATES PATENTS

| | | | |
|---|---|---|---|
| 3,461,524 | 8/1969 | Lepselter | 29/424 |
| 3,676,087 | 7/1972 | Fefferman | 204/15 |
| 3,686,080 | 8/1972 | Banfield et al. | 204/15 |
| 3,693,251 | 9/1972 | Jaccodine | 117/212 |
| 3,700,443 | 10/1972 | Reimann | 156/11 |

*Primary Examiner*—Charles E. Van Horn
*Assistant Examiner*—Jerome W. Massie
*Attorney, Agent, or Firm*—E. M. Fink

[57] ABSTRACT

An economical process for the fabrication of air-isolated crossovers eliminates several evaporation and cleansing steps utilized in prior art processes. The described procedure involves evaporating an adhesion promoter, a noble metal and copper upon a substrate, selectively removing copper from the crossover contact and conductor interconnecting areas, plating gold thereon and replating copper upon the resultant assembly. Following, the crossover preparation process parallels normal procedures.

3 Claims, 9 Drawing Figures

PATENTED JUN 17 1975 3,890,177

TECHNIQUE FOR THE FABRICATION OF AIR-ISOLATED CROSSOVERS

CROSS REFERENCE TO RELATED APPLICATION

This application is a continuation of our copending application, Ser. No. 175,501, filed August 27, 1971, now abandoned.

FIELD OF THE INVENTION

This invention relates to a technique for the fabrication of an air-isolated crossover. More particularly, the present invention relates to a technique for the fabrication of an air-isolated crossover between two conductors separated by an intermediate conductor.

DESCRIPTION OF THE PRIOR ART

During the past decade, electronic systems have increased in size and complexity, so creating a need for greater numbers of components and the required interconnections. Extensive research effort has been directed toward the fabrication of circuits which not only are reliable and stable in use but also retain those characteristics over prolonged periods of time and are capable of being manufactured economically. The beam lead technology has evolved in response to this need.

Utilization of thin film technology inherently permits a substantial reduction in individual lead connections with an accompanying increase in reliability. This reduction in individual lead connections is possible because a plurality of circuit components can frequently be formed on a single substrate from a single continuous film or from adjacent film layers inherently interconnecting the components. In those instances where conductors must cross each other without electrical contact, crossovers are required. In recent years, the beam or air-insulated type of crossover has gained widespread acceptance in the electronics industry. Such crossovers typically rely upon the use of a titanium-copper spacing layer which is deposited by vacuum evaporation and electroplating techniques upon a substrate member having a conductor pattern delineated therein, the latter also having been deposited by vacuum evaporation procedures. Workers in the art have sought for some time to develop a more economical process than that described heretofore which would eliminate the plural evaporation steps and a variety of intermediate cleansing steps.

SUMMARY OF THE INVENTION

In accordance with the present invention, this end is attained by a novel process which involves evaporating an adhesion promoter and a noble metal upon a substrate member, depositing gold upon said noble metal in a delineated circuit pattern by a plating operation, and plating copper over the resultant assembly. Following, the crossover fabrication process closely parallels prior art procedures.

BRIEF DESCRIPTION OF THE DRAWINGS

The invention will be more readily understood by reference to the following detailed description taken in conjunction with the accompanying drawing wherein.

DETAILED DESCRIPTION

Figure 1:
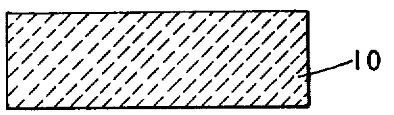
FIG. 1 is a front-elevational view in cross section of a substrate member suitable for use in the practice of the present invention.

With reference now more particularly to FIG. 1, there is shown a front-elevational view in cross section of a typical substrate member 10 suitable for use in the practice of the present invention. The substrate chosen for use herein is insulating in nature and may be selected from among any conventional material utilized in electronic circuitry such as ceramics, glass, semiconductor materials, and the like. A typical substrate material is a high alumina ceramic.

In accordance with conventional beam lead techniques, the pair of conductors which it is desired to connect by means of a crossover and the intermediate conductor are composite structures comprising at least three different metal films deposited upon each other. Although the composite conductor concept is followed in the practice of the present invention, the procedure for the preparation thereof varies from those described in the prior art.

Figure 2:
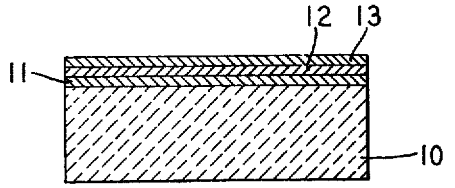
FIG. 2 is a front-elevational view in cross section of the substrate of FIG. 1 after the deposition thereon of an adhesion promoter, a noble metal and copper.

Initially, there is deposited upon substrate 10 an adhesion promoter 11 (FIG. 2), typically comprising titanium. Deposition is conveniently effected by conventional vacuum evaporation techniques. Following, a noble metal 12 selected from among the group consisting of platinum, palladium and rhodium is deposited upon the adhesion promoter. This layer which serves as the intermediate layer of the conductive composite prevents metal migration down dislocation cores and through grain boundaries. Normally, the next step in the procedure for the fabrication of a crossover would involve the deposition of a gold film upon noble metal 12. However, in accordance with the present invention, a layer of copper 13 may be deposited over the entirety of the resultant structure. This layer may be omitted to effect further economies although appropriate cleaning steps are required to remove photoresist residues from the noble metal surface prior to plating of the gold bottom conductors and prior to plating of the copper spacing layer, designated 16 below. Although the relative thicknesses of the deposited films are not critical, ranges dictated by practical considerations may be set forth as follows: Adhesion promoter, 100 to 500 angstroms, noble metal, 1000 to 4000 angstroms and copper, 1000 to 15000 angstroms.

Figure 3:
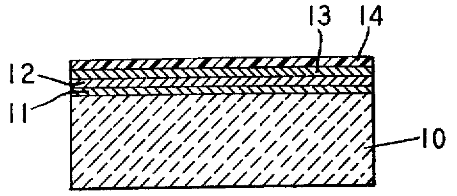
FIG. 3 is a front-elevational view in cross section of the structure of FIG. 2 after the deposition thereon of a photoresist.
Figure 4:
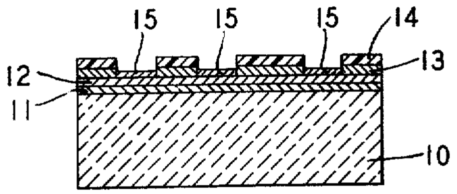
FIG. 4 is a front-elevational view in cross section of the structure of FIG. 3 after the delineation of a conductor pattern and the selective deposition of gold thereon.

Following, a photoresist 14 (FIG. 3) is deposited upon copper layer 13. Any of the commercially available photoresists commonly employed in thin film electronic technology may be used for this purpose. Next, photoengraving of the resultant structure is effected in accordance with well-known techniques for the purpose of delineating the conductor pattern upon the substrate. Shown in FIG. 4 is the structure of FIG. 3 after the delineation therein of a conductor pattern in which the copper layer 13 has been removed from the noble metal 12 in the three conductor areas and replaced by a layer of gold 15 deposited by electroplating. The thickness of gold layer 15 is not critical and may conveniently range from 30,000 to 60,000 angstroms.

Figure 5:
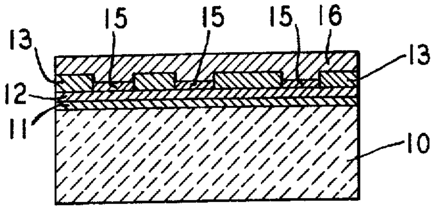
FIG. 5 is a front-elevational view in cross section of the structure of FIG. 4 after the deposition thereon of a copper spacing layer.

Next, the photoresist is removed from the remainder of the substrate thereby exposing copper layer 13 and gold layer 15. Then, a second layer of copper 16 (FIG. 5) is deposited upon the entirety of the assembly in a thickness sufficient to satisfy the requirements relative to the magnitude of the desired gap between the crossover and the intermediate conductor. Typically, copper layer 16 is plated or deposited to a thickness of approximately 1 mil.

Figure 6:
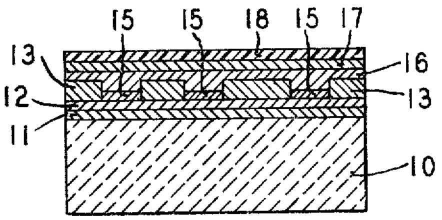
FIG. 6 is a front-elevational view in cross section of the structure of FIG. 5 after the deposition thereon of an adhesion promoter and a photoresist.
Figure 7:
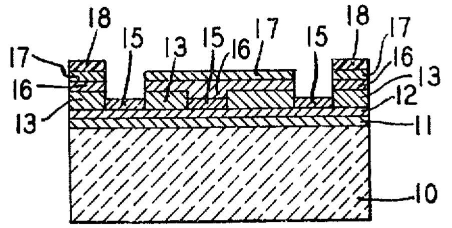
FIG. 7 is a front-elevational view in cross section of the structure of FIG. 6 after selective etching thereof.

The next step in the fabrication of a crossover in accordance with the present invention involves depositing a (second) photoresist upon copper spacing layer 16. However, prior to the deposition of the photoresist, it has been found helpful to deposit an adhesion promoter 17 (FIG. 6) upon layer 16 for the purpose of enhancing the adhesion of the photoresist to spacing layer 16. Adhesion promoter 17 typically comprises nickel, although other materials such as titanium or chromate conversion coatings are satisfactory for this purpose. Then, photoresist 18 of the type previously employed is deposited upon adhesion promoter 17 and pillar holes are delineated in the assembly by conventional photoengraving techniques. This involves exposing the photoresist, developing and etching the pillar holes above the first and third conductor regions. The photoresists selected for use in the practice of the invention may be selected from among any of the commercially available materials. In the photoengraving process the photoresist 18, adhesion promoter 17 and copper layer 16 above the first and third conductors are removed, thereby exposing gold layer 15 (see FIG. 7). Immediately thereafter the photoresist overlying adhesion promoter 17 in the area between the first and third conductors is removed, thereby exposing adhesion promoter 17.

Figure 8:
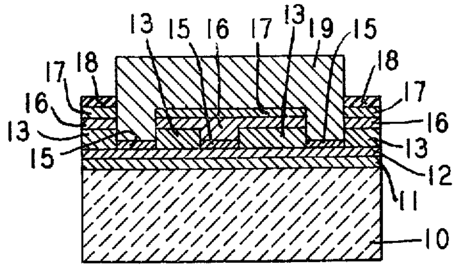
FIG. 8 is a front-elevational view in cross section of the structure of FIG. 7 after the deposition of a crossover thereon.

At this juncture, gold deposition is effected in the pillar holes upon gold layer 15 and upon adhesion promoter 17 in the region bridging the two pillar holes. Shown in FIG. 8 is gold bridging layer 19 deposited upon gold layer 15 and adhesion promoter 17.

Figure 9:
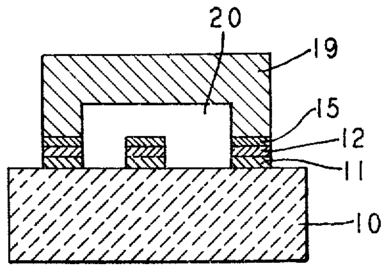
FIG. 9 is a front-elevational view in cross section of the structure of FIG. 8 after etching away unwanted material to yield an air-isolated crossover.

Finally, the isolation of gold bridging layer 19 (the crossover) is effected by removing the photoresist 18, and etching away adhesion promoter 17 and copper layer 16 in the region between the first and third conductors, so defining air gap 20 (FIG. 9). The only remaining step in the fabrication of a satisfactory structure involves the removal of adhesion promoter, noble metal and the adhesion promoter lying thereunder at the edges and the internal areas of the substrate. This end may be effected by the use of any well-known etching technique utilizing conventional etchants of the type described in Printed and Integrated Circuitry, T. D. Shlabch and D. K. Rider, McGraw Hill, New York, 1963, pp.89–99, or Printed Circuits Handbook, C. F. Coombs, Jr., Editor, McGraw Hill, New York, 1967, Chapter 6. The etchants described in the foregoing publications may be of the type which are normally selective with respect to copper in the presence of noble metals as, for example, the alkaline persulfates, or of the type which are not normally selective toward copper in the presence of noble metals, such as ferric chloride, nitric acid solutions, cupric chloride, chromic acid solutions, and the like. It will, of course, be further understood that when utilizing the etchants falling within the scope of the latter category, the noble metal is protected either by using a dilute solution of the etchant, by partially etching the copper with the non-selective copper etchant, and completing the process with a selective etchant or by monitoring the concentration of cupric ions in the nonselective etchants and replacing the etchant with a fresh solution thereof when the cupric ion concentration becomes deleterious to the noble metal. Exemplary studies have been made utilizing ammonium persulfate as a copper etchant, ferric chloride as a noble metal etchant, and dilute hydrofluoric acid for etching the adhesion promoter. Lastly, it will be appreciated by those skilled in the art that the embodiments alluded to are not restrictive in nature, and any well-known equivalent of the noted etchants may be employed in the practice of the present invention.

What is claimed is:

1. The method of fabricating, upon an insulating substrate, a pattern of deposited gold circuitry including an air-isolated gold crossover connecting a first and a third conductive area of gold and bridging a second conductive area of gold, without the necessity of multiple steps of metal evaporation, which method comprises plating (1) a gold crossover column upon each of said first and third conductive areas and (2) a gold beam over a copper spacer layer spanning said third conductive area and connecting said columns, and etching out said copper spacer layer leaving an air-isolated gold crossover CHARACTERIZED IN, as a first fabrication step, evaporating on said substrate successive layers of (1), adhesion promoter, (2) a noble metal selected from the group consisting of platinum, palladium, and rhodium which retards interdiffusion between gold and adhesion promoter, and (3) copper, and thereafter etching away those portions of the copper layer corresponding to the desired pattern of conductive circuitry with a copper etchant, plating a layer of gold upon the copper metal in the areas from which the copper has been etched, and plating a layer of copper constituting the spacer layer over the gold and copper layers in at least the area to be bridged by the crossover beam.

2. Technique for the fabrication of an air-isolated crossover between a pair of conductors separated by an intermediate conductor comprising the steps of (a) depositing upon a ceramic substrate member an adhesion promoter, a noble metal selected from the group consisting of platinum, palladium, and rhodium, and a first layer of copper, (b) delineating a conductor pattern upon the resultant structure by selectively removing copper therefrom and exposing noble metal (c) depositing a first layer of gold by plating techniques upon the exposed noble metal, thereby defining first, second, and third conductor regions, (d) depositing a second layer of copper upon the resultant assembly and selectively removing copper from said first and third conductors by etching with an ammonium compound copper etchant thereby exposing said first gold layer, (e) depositing a second layer of gold by plating techniques upon said first and third conductors and upon said second copper layer in the region therebetween, so resulting in the formation of a conductive bridge between said first and third conductors, and (f) selectively removing said first and second layers of copper, adhesion promoter, and noble metal from non-conductor regions and in the area beneath said conductive bridge, by etching with an ammonium compound copper etchant, hydrofluoric acid, and a ferric compound noble metal etchant, respectively, so resulting in the formation of a structure having an insulating air gap between a conductive crossover connecting said first and third conductors.

3. The method of fabricating, upon an insulating substrate, a pattern of deposited gold circuitry including an air-isolated gold crossover connecting a first and a third conductive area of gold and bridging a second conductive area of gold, without the necessity of multiple steps of metal evaporation, which method comprises plating (1) a gold crossover column upon each of said first and third conductive areas and (2) a gold beam over a copper spacer layer spanning said second conductive area and connecting said columns, and etching out said copper spacer layer leaving an air-isolated gold crossover CHARACTERIZED IN, as a first fabrication step, evaporating on said substrate successive layers of (1) adhesion promoter, (2) a noble metal selected from the group consisting of platinum, palladium, and rhodium which retards interdiffusion between gold and adhesion promoter, and (3) copper, and thereafter etching away those portions of the copper layer corresponding to the desired pattern of conductive circuitry with an ammonium compound copper etchant, plating a layer of gold upon the barrier metal in the areas from which the copper has been etched, and plating a layer of copper constituting the spacer layer over the gold and copper layers in at least the area to be bridged by the crossover beam.

* * * * *